US008863053B2

(12) United States Patent
Dirks et al.

(10) Patent No.: US 8,863,053 B2
(45) Date of Patent: Oct. 14, 2014

(54) INTELLIGENT TIMING ANALYSIS AND CONSTRAINT GENERATION GUI

(71) Applicant: LSI Corporation, San Jose, CA (US)

(72) Inventors: Juergen Dirks, Holzkirchen (DE); Martin Fennell, Bucks (GB); Matthias Dinter, Holzkirchen (DE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 15 days.

(21) Appl. No.: 14/010,842

(22) Filed: Aug. 27, 2013

(65) Prior Publication Data

US 2013/0346932 A1    Dec. 26, 2013

Related U.S. Application Data

(60) Division of application No. 12/388,741, filed on Feb. 19, 2009, now Pat. No. 8,539,407, which is a continuation of application No. 11/092,406, filed on Mar. 29, 2005, now Pat. No. 7,523,426.

(51) Int. Cl.
*G06F 17/50* (2006.01)

(52) U.S. Cl.
CPC ........ *G06F 17/5081* (2013.01); *G06F 17/5031* (2013.01); *G06F 17/5054* (2013.01)
USPC .......................................... 716/108

(58) Field of Classification Search
USPC .......................................... 716/108
See application file for complete search history.

(56) References Cited

U.S. PATENT DOCUMENTS

| | | | |
|---|---|---|---|
| 5,541,849 A | 7/1996 | Rostoker et al. | 716/102 |
| 5,581,738 A | 12/1996 | Dombrowski | 716/16 |
| 5,663,888 A | 9/1997 | Chakradhar | 716/6 |
| 5,801,958 A | 9/1998 | Dangelo et al. | 716/18 |
| 5,867,399 A | 2/1999 | Rostoker et al. | 716/18 |
| 5,956,256 A | 9/1999 | Rezek et al. | 716/3 |
| 5,980,092 A | 11/1999 | Merryman et al. | 716/6 |
| 6,144,262 A | 11/2000 | Kingsley | 331/57 |
| 6,205,572 B1 | 3/2001 | Dupenloup | 716/106 |
| 6,237,127 B1 * | 5/2001 | Craven et al. | 716/108 |
| 6,421,818 B1 | 7/2002 | Dupenloup et al. | 716/105 |
| 6,625,787 B1 | 9/2003 | Baxter et al. | 716/6 |
| 6,763,506 B1 | 7/2004 | Betz et al. | 716/6 |

(Continued)

OTHER PUBLICATIONS

Tygar, et al., "Efficient netlist comparison using hierarchy and randomization", Jun. 1985, ACM Press, Proceedings of the 22$^{nd}$ ACM/IEEE conference on Design Automation, pp. 702-708.

(Continued)

*Primary Examiner* — Jack Chiang
*Assistant Examiner* — Brandon Bowers
(74) *Attorney, Agent, or Firm* — Christopher P. Maiorana, PC

(57) ABSTRACT

A system generally including a clock structure analysis tool, a static timing analysis tool and a waveform tool is disclosed. The clock structure analysis tool may be configured to generate a simplified clock structure for a clock signal in a complex clock structure in a design of a circuit. The static timing analysis tool may be configured to generate a plurality of results for a plurality of intermediate signals in the simplified clock structure in response to a static timing analysis of the design. The waveform tool may be configured to generate a first representation in a graphical user interface format of the intermediate signals and the results.

20 Claims, 8 Drawing Sheets

(56) References Cited

U.S. PATENT DOCUMENTS

| | | |
|---|---|---|
| 6,836,877 B1 | 12/2004 | Dupenloup .................. 716/103 |
| 6,872,601 B1 | 3/2005 | Baxter et al. ................. 438/129 |
| 6,874,135 B2 | 3/2005 | Gupta et al. ...................... 716/4 |
| 7,203,919 B2 | 4/2007 | Suaris et al. ...................... 716/6 |
| 2002/0162086 A1 | 10/2002 | Morgan ........................ 716/18 |
| 2003/0182638 A1 | 9/2003 | Gupta et al. ...................... 716/4 |
| 2003/0196182 A1 | 10/2003 | Hahn ............................... 716/6 |
| 2004/0250224 A1* | 12/2004 | Clement et al. .................. 716/6 |
| 2005/0132316 A1 | 6/2005 | Suaris et al. .................... 716/11 |
| 2005/0144580 A1 | 6/2005 | Berkram et al. .................. 716/6 |
| 2005/0198601 A1 | 9/2005 | Kuang et al. ....................... 716/6 |
| 2006/0112359 A1 | 5/2006 | Becer et al. ........................ 716/6 |
| 2006/0123378 A1* | 6/2006 | Cizl et al. ........................ 716/18 |

OTHER PUBLICATIONS

Tygar, et al., "Hierarchical Logic Comparison", 1984, Proceedings of MIDCON '84, pp. 1-4.

* cited by examiner

INTELLIGENT TIMING ANALYSIS AND CONSTRAINT GENERATION GUI

This application relates to U.S. Ser. No. 12/388,741, filed Feb. 19, 2009, which is a divisional of U.S. Ser. No. 11/092,406 with a filing date of Mar. 29, 2005, now U.S. Pat. No. 7,523,426, each of which is incorporated by reference in their entirety.

FIELD OF THE INVENTION

The present invention relates to circuit design clock analysis generally and, more particularly, to an intelligent timing analysis of clock structures and a constraint generation graphical user interface.

BACKGROUND OF THE INVENTION

Timing constraints for application specific integrated circuits (ASIC), platform ASICs and field programmable gate array (FPGA) designs are conventionally calculated and set manually. Users extract timing criteria from data sheets of chip-external components and translate the data into constraint syntax according to different timing analysis tool languages. Relationships between data lines going to and coming from the ASIC/FPGA and corresponding clocks have to be understood and carefully described in order to have correct timing constraints.

Determining the timing constraints is especially complicated for inputs/outputs for which the constraints depend on other signals (i.e., clock signals) also coming from the ASIC. The timing criteria are recalculated with every change of the ASIC timing during the process of design completion. For designs that contain several clocks, verification of a quality of the timing constraints is difficult. Verification becomes even more important if a design can operate in different modes, where clock sources, frequencies or dependencies between clock domains can change. Verification of the design coverage is not automated and therefore error prone. The same is true for verification of validity for manually generated constraints (i.e., checking if a data transfer from one clock domain to another would really ever happen).

In engagement models where static timing verification is a shared task between a chip vendor and a customer, or if the customer does not have static timing analysis (STA) tools in-house and therefore seeks help from consultants, generation of a constraint specification becomes a difficult task. In particular, different parties may have completely different understandings of the design "worlds" and a link between the worlds is hard to define. Commonly, one group has a better knowledge about STA for chip internal portions, including physical information and methodology. Another group has a complete overview of the chip environment, including operating modes, board parameters and external component specifications.

In addition to static timing verification, the task of generating constraints for a timing driven cell placement and layout tool is difficult. Conventional tools often only support one set of constraints. Therefore, a mix of different functional modes plus some test criteria are created in one set of constraints that represent a worst case scenario that is often not a real scenario.

The past years have shown that although the above described problems are known, no solution is currently in place. Lessons learned sessions of completed chip projects list the timing constraint topic as an issue for almost every design. The lack of verification tools for the quality of manually generated static timing analysis constraints leaves the verification task to pure visual inspection of the scripts and the reports. The visual inspections often lead to design mistakes.

The process of extracting and translating datasheet information for the chip-external components takes a long time and is error prone. In addition, the extracting and translating are based on abstract understandings of the external connectivity rather than a real schematic that describes the chip environment (i.e., a board layout). The manual process leads to incomplete constraint definitions as elements can be easily overlooked. Furthermore, as signals on chip I/Os are described as coming from or going to virtual places outside the chip under investigation, the timing reports generated by the STA tools (usually in pure ASCII format) are difficult to read and understand.

In engagement models where static timing analysis is shared between different parties, a long time is spent in discussing and understanding the timing criteria from all sides, as people have different technical backgrounds. In addition, long computation runtimes are used to debug the constraints. Debugging the constraints is commonly done only very late in the design flow when sufficient timing information is provided (like standard delay format (SDF) backannotation) to get useful timing reports. Furthermore, scripts are difficult to set up and maintain with many possible sources of errors. Significant valuable engineering resources have to be assigned to complete the scripting tasks.

SUMMARY OF THE INVENTION

The present invention concerns a system generally comprising a clock structure analysis tool, a static timing analysis tool and a waveform tool. The clock structure analysis tool may be configured to generate a simplified clock structure for a clock signal in a complex clock structure in a design of a circuit. The static timing analysis tool may be configured to generate a plurality of results for a plurality of intermediate signals in the simplified clock structure in response to a static timing analysis of the design. The waveform tool may be configured to generate a first representation in a graphical user interface format of the intermediate signals and the results.

The objects, features and advantages of the present invention include providing an intelligent analysis of clock structures and a constraint generation graphical user interface that may (i) reduce or eliminate a task of translating timing criteria derived from a structural analysis of a chip and a local environment into STA tool specific language, (ii) present timing constraints in script form that may be easily analyzed and modified in a simplified schematic view, (iii) analyze different modes of a design, (iv) enable definitions and modifications of the timing constraints in a single tool for timing verification, (v) enable definitions and modifications of the timing constraints in a single tool for timing driven layout, (vi) generate easy to read static timing analysis reports for people with different technical backgrounds, using schematics and waveform views instead of ASCII report files and/or (vii) reduce or eliminate spending engineering resources on manual timing constraint generation tasks.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
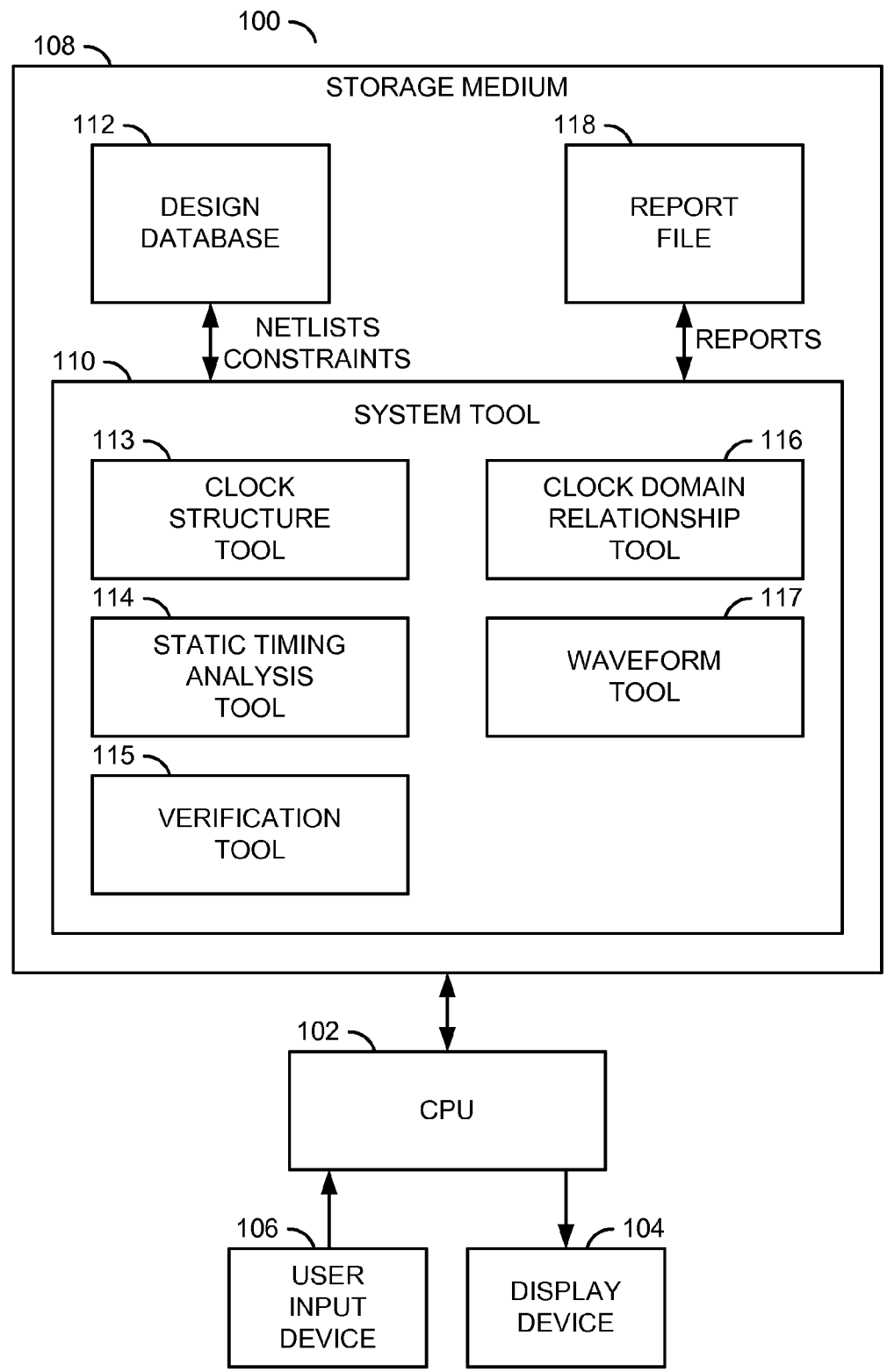
FIG. 1 is a block diagram of system in accordance with a preferred embodiment of the present invention.

Referring to FIG. 1, a block diagram of system 100 is shown in accordance with a preferred embodiment of the present invention. The system (or apparatus) 100 generally comprises a processor 102, a display device 104, a user input device 106 and a storage medium 108. The storage medium 108 may store a software tool 110 and a database 112. In one embodiment, the software tool 110 and the database 112 may be stored in separate media.

The processor 102 may be referred to as a central processor unit (CPU). The CPU 102 may be operational to execute the software tool 110 and access the database 112. The CPU 102 may communicate graphical, textual, and other information to the display device 104 for presentation to a user. The input device 106 may provide data from the user back to the CPU 102.

The software tool 110 may be operational to generate a set of constraints for static timing analysis of a circuit design. The software tool 110 generally comprises timing constraint generation tasks and graphical user interface (GUI) generation tasks. The software tool 110 generally presents a graphical user interface suitable for (i) analyzing clocking structures, (ii) define timing constraints for a design in different ways and (iii) verify a quality of the constraints.

The database 112 may be operational to store a netlist of the circuit design being analyzed and technology information regarding the circuit design (e.g., cell pin attributes such as clocks on flip flops or RAMs). The database 112 may also store the constraints generated and/or manually entered for the circuit design.

The software tool 110 may analyze a structure of one or more clock networks in the circuit design. The analysis generally involves (i) examining each cell (or module) pin of the circuit design with a clock attribute and (ii) traveling backwards through the circuit design until a particular pin with a valid clock source attribute is found. The particular pin may be a chip input pin, a flip flop output pin, a phase lock loop (PLL) output pin or other user-defined pin. In cases where a found cell pin may not be a valid clock source (e.g., pins of logic gate such as multiplexers), the software tool 110 may continue to propagate backwards until a valid clock source is found. If no valid clock source is found, an error message may be generated.

The software tool 110 generally comprises a software module (or tool) 113, a software module (or tool) 114, a software module (or tool) 115, a software module (or tool) 116 and a software module (or tool) 117. The software module 113 may be referred to as a clock structure analysis tool. The clock structure analysis tool 113 may be operational to generate a simplified clock structure view based on a netlist, constraints and technology information stored in the database 112.

The software module 114 may be referred to as a static timing analysis tool. The static timing analysis tool 114 may be operational to generate the set of constraints by performing a static timing analysis of the circuit design. The constraints may be stored in the database 112 and/or presented to the module 117 for visual display on the display device 104.

The software module 115 may be referred to as a verification tool. The verification tool 115 may be operational to perform one or more verifications of the circuit design to create report information. The verifications may include, but are not limited to a static timing verification, clock source verification and design coverage verification. The verification functions may generate report data presented to a report file 118 for storage.

The software module 116 may be referred to as a clock domain relationship tool. The clock domain relationship tool 116 may be operational to determine if any functional paths exist between different clock domains in the circuit design. If domain crossings are found, the clock domain relationship tool 116 may attempt to determine if a false path exists or if a multi-cycle path exists.

The software module 117 may be referred to as a waveform tool. The waveform tool 117 may be operational to translate reports and annotations generated by the other tools 113-116 into the previously entered schematic for presentation in a graphical interface format to the user via the display device 104. Generally, the resulting waveform views may reflect the results of the static timing analysis runs.

The report file 118 may be an electronic file configured to store reports generated by the other tools 113-117 in the system tool 110. The report file 118 may reside in the same storage medium 108 as the system tools 110, or in the same memory as the database 112 (if not the storage medium 108). The report file 118 may be accessed by the CPU 102 and all software processes, routines, modules and/or tools residing in the software tool 110.

Figure 2:
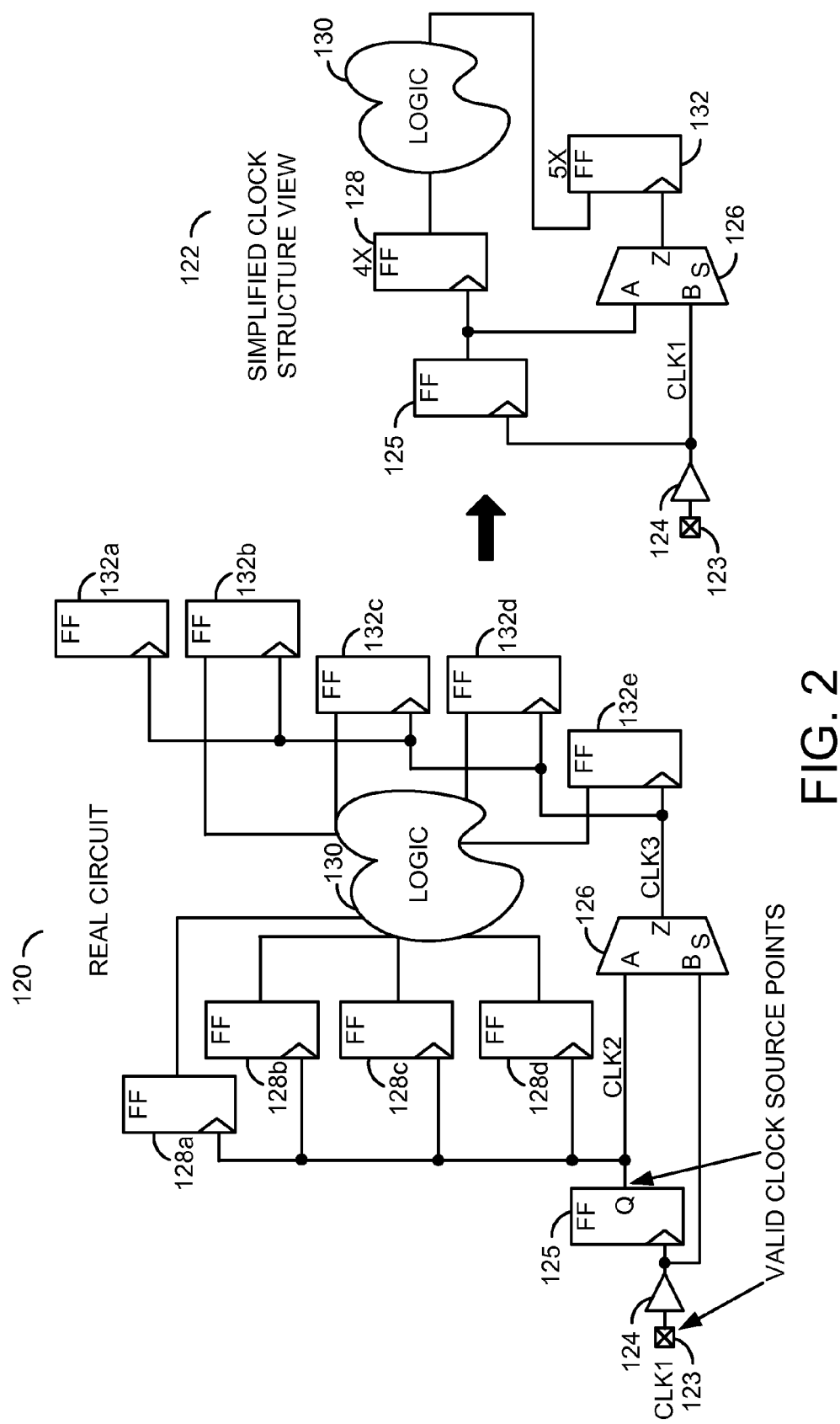
FIG. 2 is a diagram of an example schematic simplification.

Referring to FIG. 2, a diagram of an example schematic simplification is shown. A normal circuit view 120 may be converted into a simplified schematic view 122 by the software tool 110. In the example, an original clock signal (e.g., CLK1) may be received at a node 123 and may be presented to a buffer 124. The buffer 124 may present the signal CLK1 to a clock input of a first flip flop 125 and a data input (e.g., B) of a multiplexer 126. An intermediate clock signal (e.g., CLK2) may be generated by the first flip flop 125. The signal CLK2 may be received at each clock input of intermediate flip flops 128a-128d and another data input (e.g., A) of the multiplexer 126. The multiplexer 126 may generate another intermediate clock signal (e.g., CLK3) from either of the signals CLK1 or CLK2 based on a value received at a select input node (e.g., S). The flip flops 128a-128d may generate data signals to drive the main logic 130 of the circuit design. Output signals from the logic 130 may be latched by the end flip flops 132a-132e. Each of the end flip flops 132a-132e may receive the signal CLK3 at a clock input.

The simplified circuit view 122 may be referred to as a simplified clock structure view, or simplified view for short. The simplified view 120 generally comprises the node 123, the buffer 124, the original flip flop 125 and the multiplexer 126. Since each of the intermediate flip flops 128a-128d receives the same signal CLK2, the simplified view 122 replaces the flip flops 128a-128d with a single flip flop 128.

An indicator "4x" above the flip flop 128 generally signifies that the flip flop 128 in the simplified view 122 represents four flip flops 128a-128d in the normal view 120. Likewise, the end flip flops 132a-132e may be represented as a single flip flop 132 in the simplified view 122.

The software tool 110 generally creates the simplified schematic view of the clock structures from the more complex clock structures in the actual circuit design. For example, a large number of flip flops having common clock inputs all connected to the same net may be represented by a single flip flop. The single flip flop may be represented on the display device 104 as an object (or device or cell) symbol with an attached number indicating the real number of flip flops being represented. Other objects having clock inputs, such as random access memory (RAM), registers, and the like, may also be represented in a simplified schematic view of a reduced clock structure.

The software tool 110 generally allow the user to select different objects in the simplified schematic view causing attributes, such as a full hierarchical name, to be displayed. For representations of flip flops, RAMS and other cells with clock inputs, the software tool 110 may provide a capability to extract a complete list of the cell data.

Figure 3:
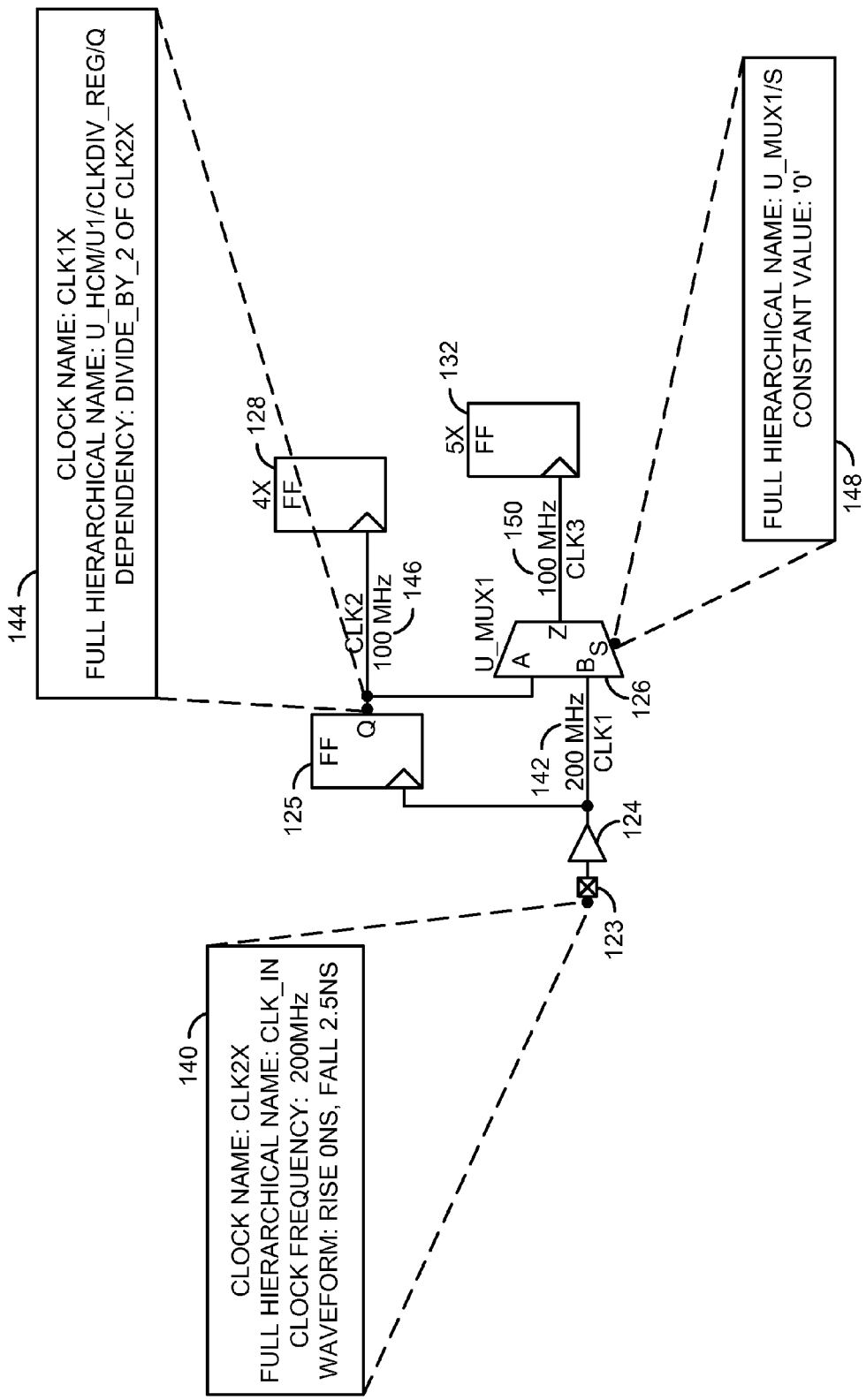
FIG. 3 is a diagram of an example view of clock source assignments.

Referring to FIG. 3, a diagram of an example view of clock source assignments is shown. The clock source assignments generally include, but are not limited to, a clock name, a full hierarchical name, a clock frequency, a waveform rise time, a waveform fall time, a dependency and/or a constant value. In the example, the signal CLK1 may have a set of assignments 140 at the input node 123. A separate frequency value 142 for the signal CLK1 may be shown near an output node of the buffer 124.

A second set of assignments 144 may be shown for the signal CLK2 associated with an output node (e.g., Q) of the flip flop 125. A frequency value 146 may be displayed near the output node of the flip flop 125.

A third set of assignments 148 may be provided for a select input node (e.g., S) of the multiplexer 126. The assignments 148 may present the full hierarchical name of the select input node and a constant value (e.g., zero) being applied to the select input node. A frequency value 150 may be shown for an output node (e.g., Z) of the multiplexer 126. The frequency value 150 as illustrated may show that the signal CLK3 is being generated from the signal CLK2 (e.g., both 100 MHz).

For valid clock source pins (e.g., input node 123), the software tool 110 generally allows a user to specify names, clock timing waveforms and potential relationships to other clocks interactively in the GUI. The specifying may include clock signals being generated from other clock signals (e.g., derivation by division or multiplication).

Some information fields in the GUI form, such as the "Full Hierarchical Name" field may be populated automatically by the software tool 110. In cases where clock signals may be gated, constraints for the gating inputs other than the clock inputs may also be setable through the GUI. The software tool 110 generally displays which clock signal is propagated through the logic gate using colors in the schematic view. After the clock signals have been specified, the schematic view may carry the clock frequency values on the clock nets (e.g., frequency values 142, 146 and 150).

Figure 4:
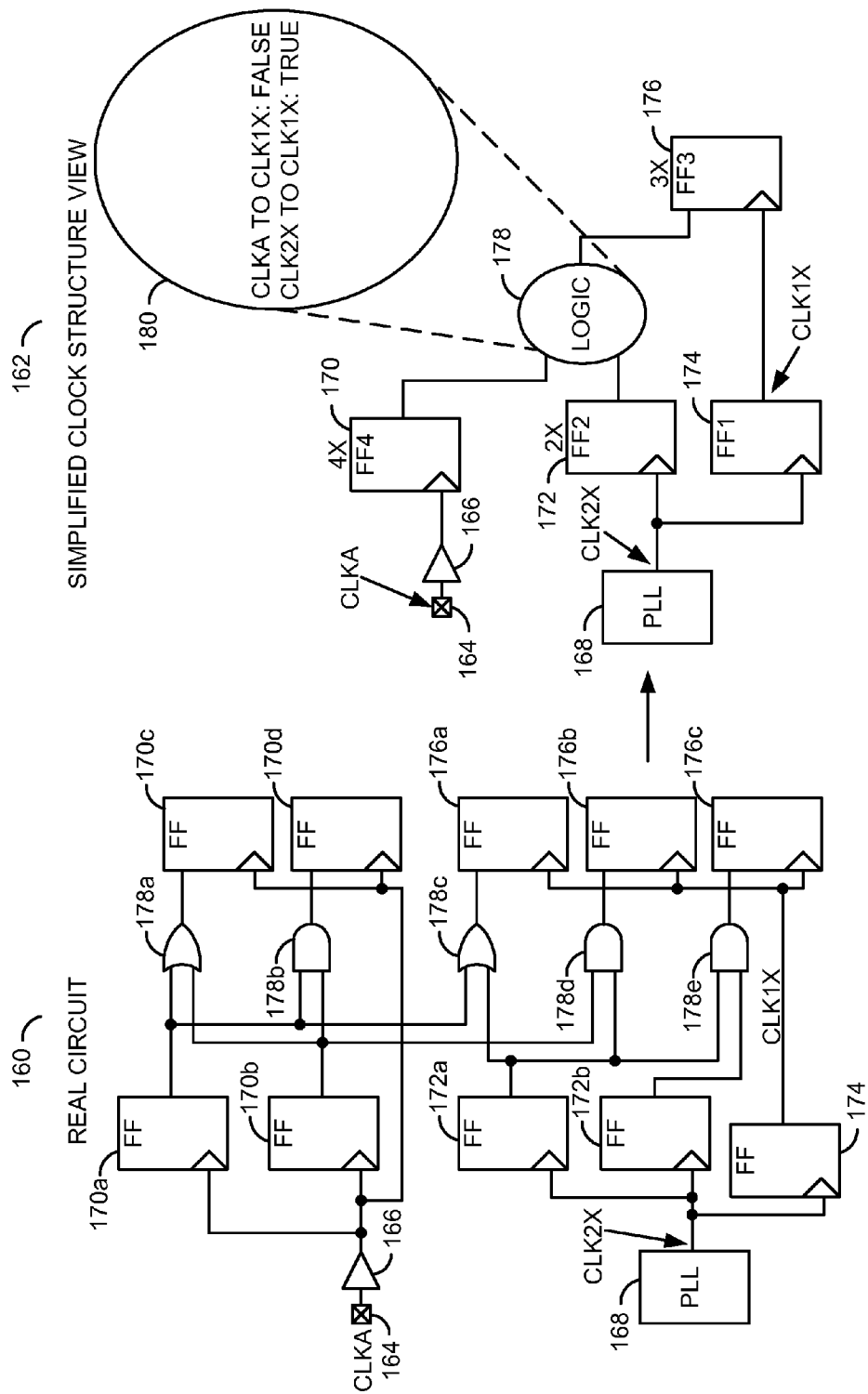
FIG. 4 is a diagram of an example simplification of a clock domain crossing path and validity specification.

Referring to FIG. 4, a diagram of an example simplification of a clock domain crossing path and validity specification is shown. A full (or complex) schematic view 160 of a circuit design may be converted into a simplified clock structure view 162. A first clock signal (e.g., CLKA) may be received at an input node 164 and a buffer 166 in the full schematic view 160. A second clock signal (e.g., CLK2X) may be generated by a PLL 168.

A first group of flip flops 170a-170d may have clock inputs receiving the signal CLKA in the full view 160. The flip flops 170a-170d may be replaced by a single flip flop 170 in the simplified view 162.

A second group of flip flops 172a-172b may have clock inputs receiving the signal CLK2X. The flip flops 172a-172b may be represented by a single flip flop 172 in the simplified view 162.

A flip flop 174 may also have a clock input receiving the signal CLK2X. However, flip flop 174 may generate an intermediate clock signal (e.g., CLK1X) feeding the clock inputs of the flip flops 176a-176c. Flip Flop 174, describing a clock source, is represented as-is in the simplified clock structure view 162, whereas flip flips 176a-176c may be represented by a single flip flop 176. Multiple logic gates 178a-178e shown in the full view 160 may be replaced in the simplified view 160 by a logic cloud 178.

The software tool 110 generally has a capability to determine if any functional paths exist between different clock domains. In cases where such paths are existing, the software tool 110 may display the functional paths as connections between representations of path start points and end points (e.g., flip flops or RAMs) separated by a symbol (e.g., the logic cloud 178). Opening the logic cloud 178 generally displays a subwindow 180 that may have a capability to define false paths between certain clock domains by setting such attributes. In the example shown, the subwindow 180 may indicate that a potential path for the signal CLKA to reach the flip flop 176 driven by the signal CLK1 is a false path. A potential path for the signal CLK2X to the flip flop 176 is a true path through the logic gates 176a-176c.

Figure 5:
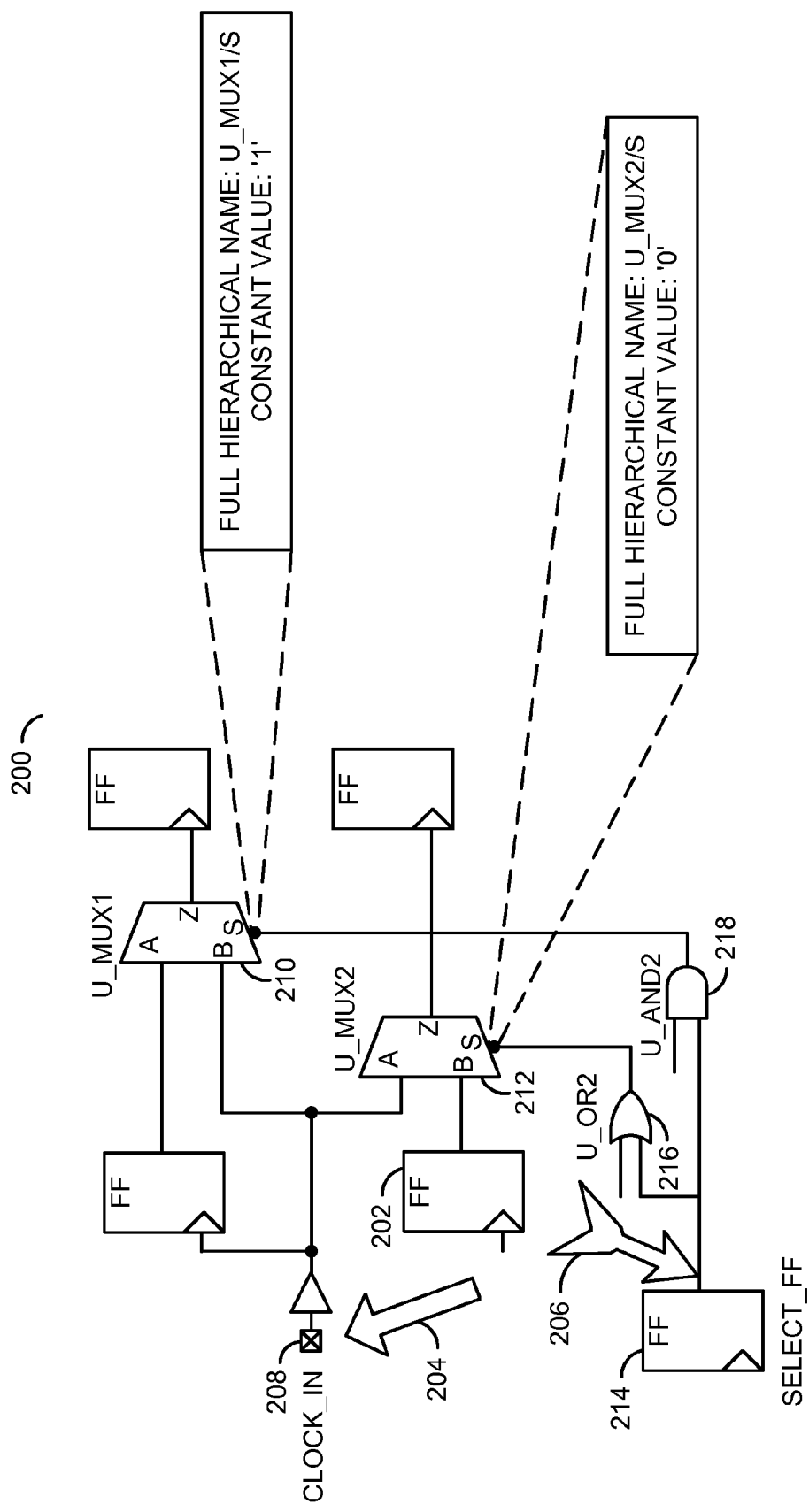
FIG. 5 is a diagram of an example constant value contradiction check.

Referring to FIG. 5, a diagram of an example constant value contradiction check is shown. A simplified and/or complex schematic view 200 of a circuit design may be displayed on the display device 104. The software tool 110 generally checks the design to determine if all cell pins with clock attributes receive one of the specified clocks. Cell pins (or pins of representations of several cells) which do not receive any specified clock signal (e.g., flip flop 202) may be highlighted by the software tool 110 in the GUI with a pointer 204 to potential clock sources.

Constants (e.g., for clock propagation through logic gates) may be set only to flip flop output nodes and chip input nodes. However, the software tool 110 may allow constants for logic gates pins to be set directly. For such cases, the software tool 110 may be operational to perform a functional analysis of logic cones to check for contradicting constant definition. In cases where constants may be defined directly at an input pin of a logic gate, the software tool 110 may propagate backwards through the design to a valid starting point for the constants (e.g., flip flop output nodes and chip input nodes). A check between different settings on logic gates pins may be performed to detect conflicts. The software tool 110 may generate a warning flag 206 if the same valid starting point is found to have two different values for two different constant settings. As such, unrealistic timing checks may be avoided.

For example, to propagate a clock signal (e.g., CLOCK_IN) from an input pin 208 of a chip through two multiplexers 210 and 212, settings for the select pins (e.g., S) of the multiplexers 210 and 212 should simultaneously be a logical one (e.g., 1) and a logical zero (e.g., 0), respectively. Searching backwards from the select pins S of both of the multiplexers 210 and 212, an output pin of a flip flop 214 is reached as a valid starting point of the logic cones. Examining the logic gates 216 and 218 that generate the select signals for multiplexers 210 and 212 generally indicates that the flip flop 214 would have to present both "0" and "1" at the same time. Therefore a special warning (e.g., highlight 206) for the above a set of constraints may be generated by the software tool 110.

Figure 6:
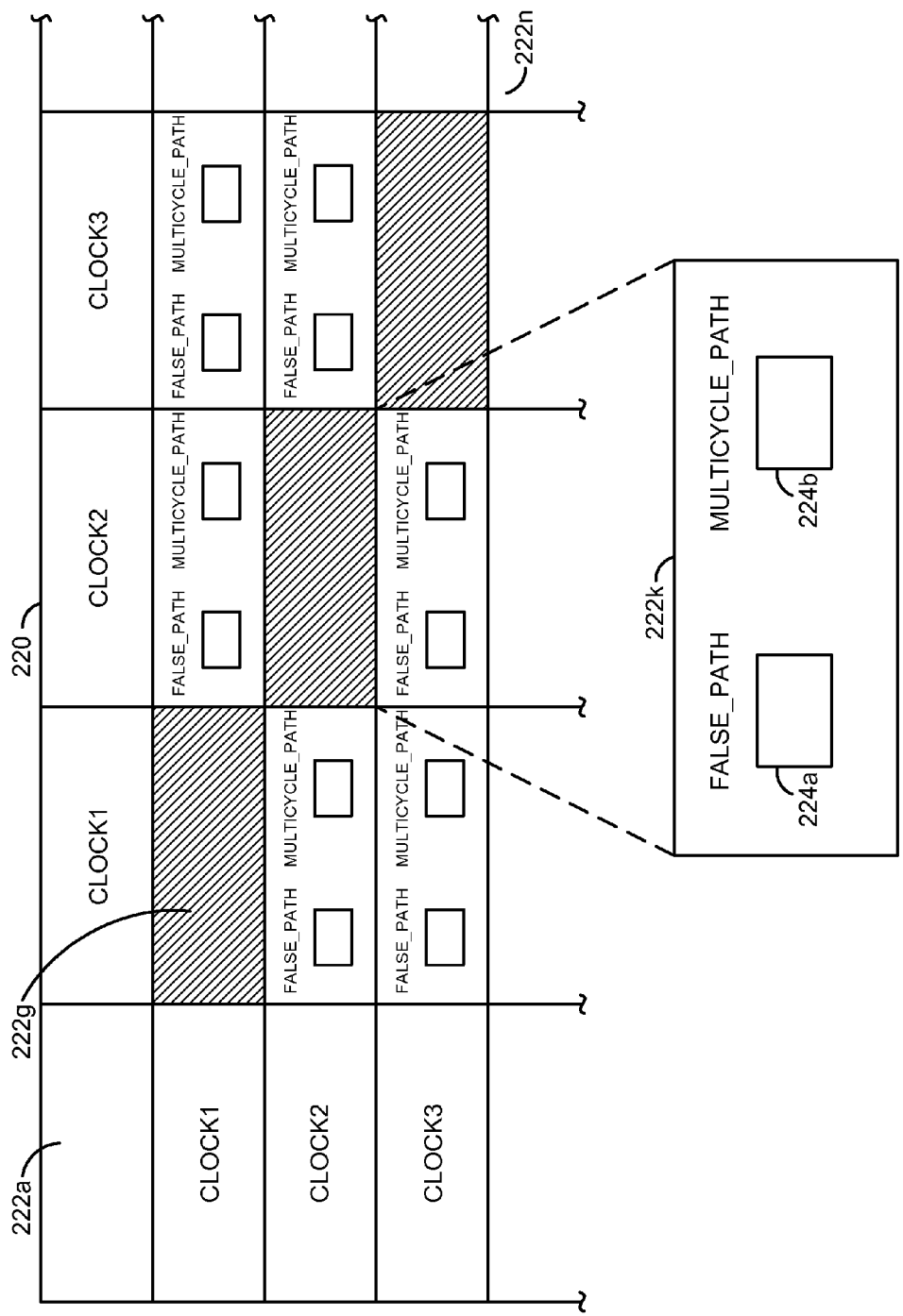
FIG. 6 is a diagram of an example clock-to-clock path exception table.

Referring to FIG. 6, a diagram of an example clock-to-clock path exception table 220 is shown. The table 220 generally comprises a grid of multiple cells 222a-222n. A horizontal index of clock signals may be displayed along a top row of the cells 222a-222n. A vertical index of the clock signals may be displayed along a left column of the cells 222a-222n. Each cell 222a-222n having the same clock signal in the horizontal index as in the vertical index (e.g., cell 222g) may be presented as a blank cell.

Each cell 222a-222n having different clock signals in the associated horizontal index and the associated vertical index (e.g., cell 222k) may present a plurality of buttons 224a-224b. The button 224a may be referred to as a false path button. The false path button 224a may be user selectable to view and/or edit false path information for a simplified clock structure view. The button 224b may be referred to as a multi-cycle path button. The multi-cycle path button 224b may be user selectable to view and/or edit multi-cycle path information for a simplified clock structure view.

After defining all clock sources, setting the constants on clock gating cells and specifying false-paths for domain crossings in the schematic view, the software tool 110 may be operational to generate the clock-to-clock-table 220. The table 220 generally provides a user capability to set other false paths and/or multi-cycle paths in addition to the false paths and/or multi-cycle paths defined in the schematic.

After all definitions have been made, the software tool 110 may save a snapshot of the actual scenarios established by the definitions. The snapshot may be named by the user (e.g., a mode name representative of the actual settings). When the user has completed editing the settings for all potential modes, the software tool 110 may perform an analysis concerning all modes to check if all potential clock sources are used at least once. Another portion of the analysis may elaborate if all different inputs of clock gating logic have been set to both the logical zero state and the logical one state at least once within all modes.

Figure 7:
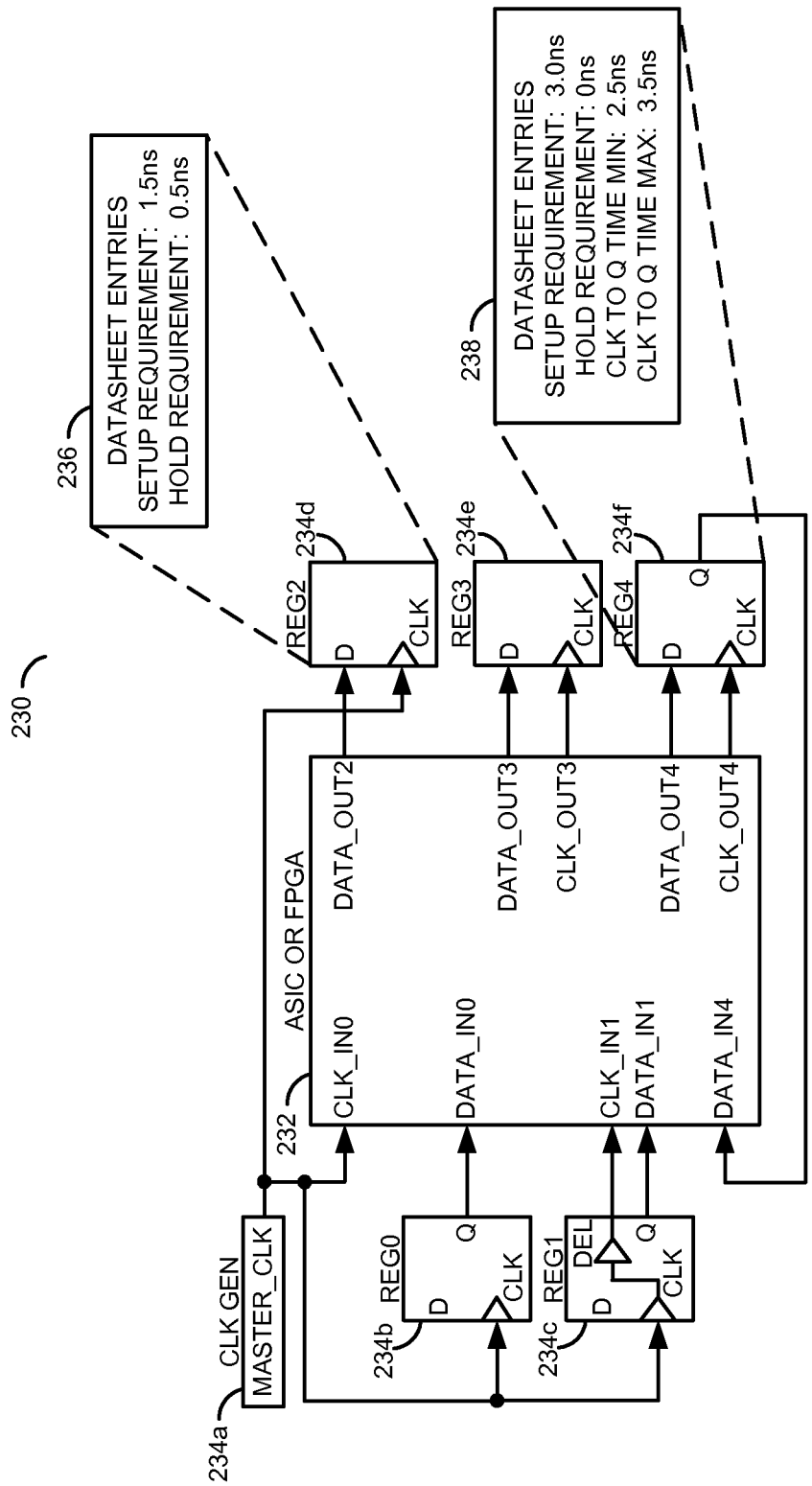
FIG. 7 is a diagram of example drawing view of connections between an ASIC design and external components.

Referring to FIG. 7, a diagram of example drawing view 230 of connections between an ASIC design 232 and external components 234a-234f is shown. For data I/Os of the ASIC design (e.g., DATA_IN0, DATA_IN1, DATA_IN4, DATA_OUT2, DATA_OUT3 and DATA_OUT4), the software tool 110 may be operational to allow the user to draw connections to external devices 232a-232f that may be modeled in different ways. The connectivity of the circuit design to chip-external components may be represented in a schematic drawing view 230, for example, in subwindows 236 and 238. The schematic drawing view 230 may be saved and loaded if available. In one embodiment, the software tool 110 may be operational to read certain formats of schematics, usually generated by customers as part of a broad or similar system level chip environmental design. The schematics may cover a part of an interface between the static timing verification of the chip and the customer environmental specifications.

The modeling of the external devices 234a-234f, which may be connected to the chip I/Os, may be automated by the software tool 110. Furthermore, the software tool 110 may provide simple manual entry of datasheet parameters (e.g., usually available for components on the market) and corresponding timing criteria. The entered data may be translated automatically to currently available STA tool languages by the software tool 110. Therefore, the conventional difficulties of generating STA constraints for chip I/Os and the risk for ending with incomplete constraints may be minimized. As shown in FIG. 7 for the flip flops 234d and 234f, a mouse click would open a form in the GUI in which timing parameters may be entered. In one embodiment, the external components 234a-234f may be taken from a previously generated library such that the user may avoid entering values in the forms. As such, the burden and risks of mistakes during the conventional manual translation process may be eliminated.

The software tool 110 may be operational to automatically translate all parameters assigned to all portions of the schematic in the GUI to constraints for different STA tools available on the market using appropriate proper syntax. Therefore, the software tool 110 generally builds an interface between abstract modeling of the timing constraints (that may easily be understood by people with different technical backgrounds) and the real static timing verification environment (that may be tool specific and difficult to learn for all parties involved in STA, such as system level or board designers).

After running a static timing verification, reports generated by currently available tools may be translated and annotated to the corresponding parameters of the previously entered schematic into the GUI. In addition, waveform views may be generated reflecting the results of the static timing analysis runs. Therefore, reading and understanding the reports may become much easier. Also a common basis for discussion of results between different parties involved in STA review is generated, which is generally easy to understand.

Figure 8:
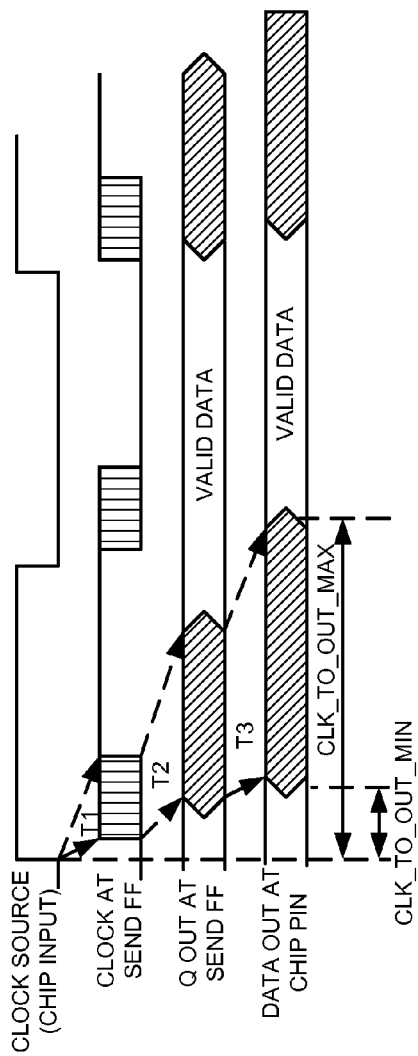
FIG. 8 is a diagram of example timings for chip input/output signals.

Referring to FIG. 8, a diagram of example timings for chip I/O signals is shown. Techniques for displaying the signal waveforms may cover different aspects. For example, the timing of an output data bus may be described in relation to a certain clock, including minimum and maximum delays as well as the skew between the bits of a bus. The above approach may be used to generate conventional chip data sheets and therefore increases readability for different people involved in the chip design. Numbers for various parameters (e.g., CLK_TO_OUT_MIN and CLK_TO_OUT_MAX) may be the values specified in a device data sheet.

A first timing parameter (e.g., T1) may be a delay from a clock source (e.g., chip input) to a clock pin of a sending flip flop. The representation of T1 may be based on a best and a worst case operating condition. The representation of T1 may also be based an earliest and a latest flip flop clock for a signal bus.

A second timing parameter (e.g., T2) may be a delay from a clock pin of the sending flip flop to an output pin (e.g., Q) of the sending flip flop. A spread of T2 generally covers a best and a worst case operating condition. The parameter T2 may also show an earliest and a latest switching flip flop. The parameter T2 may present a difference between a rising and a falling edge of the associated signal.

A third parameter (e.g., T3) may be a delay from the Q output pin of the sending flip flop to a chip output pin through potential logic gates. A spread of T3 may cover a best and a worst case operating condition. The parameter T3 may show an earliest and a latest switching flip flop. Furthermore, T3 may show a difference between a rising and a falling edge of the associated signal.

Figure 9:
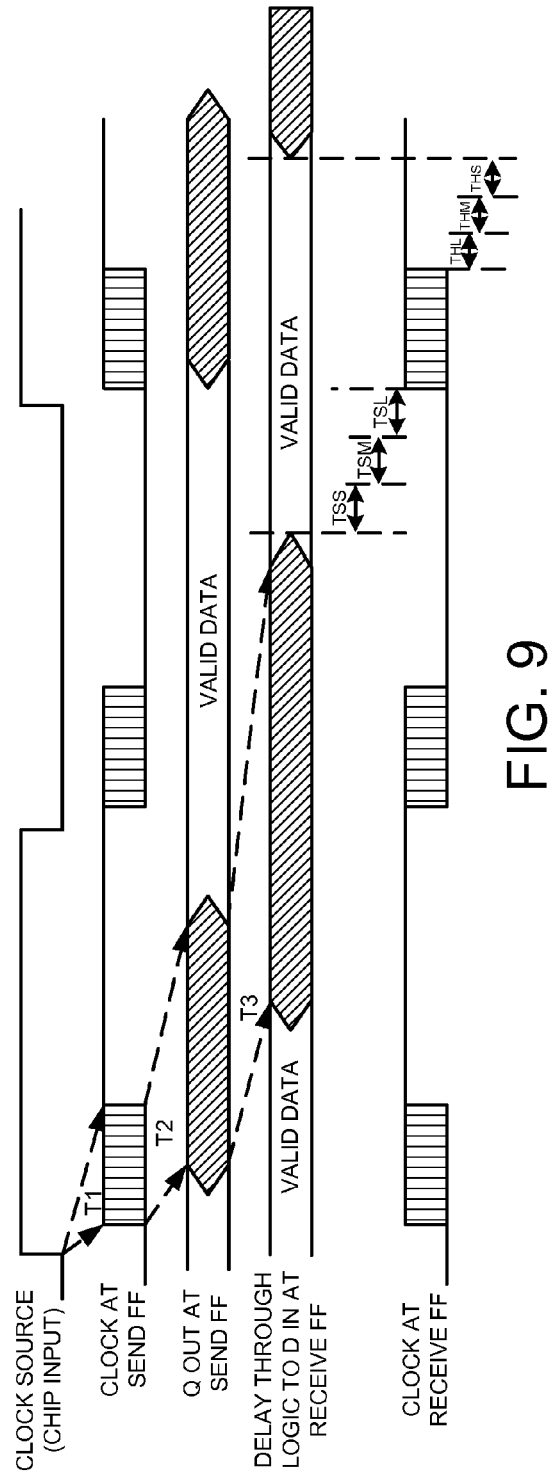
FIG. 9 is a diagram of example waveforms.

Referring to FIG. 9, a diagram of example waveforms is shown. The timing between two flip flops in a design may be illustrated in the example. A minimum and a maximum clock insertion delay (e.g., generally determined by a given operating conditions for process, voltage and temperature) from a source of the clock signal to the clock pins of the two flip flops may be illustrated. Furthermore, the software tool 110 may be operational to display different types of extra margins. The extra margins may be (i) specified in the timing constraints (e.g., a clock uncertainty to model jitter), (ii) calculated by the software tool 110 (e.g., pessimism to model on chip variations) or (iii) given by one or more technology libraries. Annotated incremental standard delay format (SDF) files (e.g., to account for crosstalk delay effects) may be made visible the same way. As such, the user may easily understand where each portion of the timing comes from. The understanding could help in discussions where the timing is tight and too much extra margin may have been applied.

A parameter (e.g., TSS) may be a setup-time slack time for a difference between a specified and real arrival time. A parameter (e.g., TSM) may define a setup time margin at the receive flip flop. A parameter (e.g., TSL) may be a setup time constraint at the receive flip flop. A parameter (e.g., THL) may define a hold time at the receiver flip flop. A parameter (e.g., THM) may be a hold time margin at the receive flip flop. A parameter (e.g., THS) may be a hold-time slack time for a difference between a specified and a real earliest change time.

A parameter (e.g., T1) may be a delay from the clock source (e.g., chip input) to a clock pin of a sending flip flop. T1 may cover a best and a worst case operating condition and an earliest and a latest time for a specified clock uncertainty.

A parameter (e.g., T2) may be a delay from the clock pin of the sending flip flop to the Q output pin. The parameter T2 may cover a best and a worst case operating condition and a difference between a rising and a falling edge of the associated signal.

A parameter (e.g., T3) may be a delay from the Q output pin of the sending flip flop to a D input pin of a receiving flip flop through logic gates. The parameter T3 generally covers a best and a worst case operating condition and a difference between a rising and a falling edge of the associated signal.

The software tool 110 may provide a timing constraint set for timing driven cell placement and layout tools. The software tool 110 may be operational to analyze all defined snapshots (or modes) and choosing a worst case scenario for the different clock domains and clock domain crossings. However, the software tool 110 may take care of given false path and multi-cycle path definitions. If the software tool 110 finds the worst case scenario, the tool may translate the calculated scenario back into a simplified schematic. Showing the clock definitions, possible clock domain transfers, constant settings and the like in the simplified schematic view generally helps a user to debug the circuit design and the constraints used for timing driven tools.

The present invention may provide a graphical view of a chip (or circuit) design. The graphic view of clock networks and timing may give a user a comprehensive overview of structure for timing critical elements and the related timing criteria. The software tool may provide an automatic translation of timing criteria from an easy to understand schematic view with annotated parameters to a tool specific timing constraint languages. The tool may also provide automatic translations for a set of timing constraints into a simplified schematic. Furthermore, the software tool may perform an automatic backannotation of STA results reports into a schematic view, thus adding to the waveform views.

The function performed by the present invention may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. A method for analyzing a design of a circuit comprising the steps of:
    (A) identifying with a processor a plurality of paths that cross between a plurality of clock domains in said design;
    (B) generating a display viewable to a user on a display device, said display illustrating a table having a plurality of relationships among said clock domains, each of said relationships describing a plurality of conditions of said paths that cross between said clock domains; and
    (C) translating with said processor said relationships into a plurality of timing constraints of said clock domains in a file of said design.

2. The method according to claim 1, wherein said table has a plurality of cells with a plurality of clock signals listed along both (i) a first index of said table and (ii) a second index of said table.

3. The method according to claim 2, wherein each of said cells in said table that is associated with two different signals of said clock signals indicates a false path type of said conditions.

4. The method according to claim 2, wherein each of said cells in said table that is associated with two different signals of said clock signals indicates a multi-cycle path type of said conditions.

5. The method according to claim 1, further comprising the step of:
    displaying information related to a given one of said conditions on said display device in response to a user selection of said given condition from said table.

6. The method according to claim 2, further comprising the step of:
    transferring data entered by said user in at least one of said cells of said table into said file of said design.

7. The method according to claim 1, further comprising the step of:
    analyzing a plurality of modes of said design to determine if each of a plurality of clock sources of said clock domains is used at least once.

8. The method according to claim 1, further comprising the step of:
    analyzing a plurality of modes of said design to determine if each of a plurality of gates in said design actively gate at least once a corresponding one of a plurality of clock signals in said clock domains.

9. The method according to claim 1, wherein the steps are preformed by said processor executing a plurality of instructions contained within a computer readable storage device.

10. An apparatus comprising:
a processor configured to execute a plurality of instructions to analyze a design of a circuit; and
a computer readable storage device containing said instructions, said instructions causing said processor to (i) identify a plurality of paths that cross between a plurality of clock domains in said design, (ii) generate a display viewable to a user on a display device, said display illustrating a table having a plurality of relationships among said clock domains, each of said relationships describing a plurality of conditions of said paths that cross between said clock domains and (iii) translate said relationships into a plurality of timing constraints of said clock domains in a file of said design.

11. The apparatus according to claim 10, wherein said table has a plurality of cells with a plurality of clock signals listed along both (i) a first index of said table and (ii) a second index of said table.

12. The apparatus according to claim 11, wherein each of said cells in said table that is associated with two different signals of said clock signals indicates a false path type of said conditions.

13. The apparatus according to claim 11, wherein each of said cells in said table that is associated with two different signals of said clock signals indicates a multi-cycle path type of said conditions.

14. The apparatus according to claim 10, wherein said instructions further cause said processor to display information related to a given one of said conditions on said display device in response to a user selection of said given condition from said table.

15. The apparatus according to claim 11, wherein said instructions further cause said processor to transfer data entered by said user in at least one of said cells of said table into said file of said design.

16. The apparatus according to claim 10, wherein said instructions further cause said processor to analyze a plurality of modes of said design to determine if each of a plurality of clock sources of said clock domains is used at least once.

17. The apparatus according to claim 10, wherein said instructions further cause said processor to analyze a plurality of modes of said design to determine if each of a plurality of gates in said design actively gate at least once a corresponding one of a plurality of clock signals in said clock domains.

18. An apparatus comprising:
means for identifying a plurality of paths that cross between a plurality of clock domains in a design of a circuit;
means for generating a display viewable to a user on a display device, said display illustrating a table having a plurality of relationships among said clock domains, each of said relationships describing a plurality of conditions of said paths that cross between said clock domains; and
means for translating said relationships into a plurality of timing constraints of said clock domains in a file of said design.

19. The apparatus according to claim 18, wherein said table has a plurality of cells with a plurality of clock signals listed along both (i) a first index of said table and (ii) a second index of said table.

20. The apparatus according to claim 19, wherein each of said cells in said table that is associated with two different signals of said clock signals indicates a false path type of said conditions.

* * * * *